United States Patent
Nakakura et al.

(10) Patent No.: US 10,781,531 B2
(45) Date of Patent: Sep. 22, 2020

(54) METHOD FOR PRODUCING NICKEL-CONTAINING HYDROXIDE

(71) Applicant: SUMITOMO METAL MINING CO., LTD., Tokyo (JP)

(72) Inventors: Shuhei Nakakura, Ichikawa (JP); Kazuhiko Tsuchioka, Niihama (JP); Koichiro Maki, Tokyo (JP); Motoaki Saruwatari, Niihama (JP); Kazuomi Ryoshi, Niihama (JP); Yoshihiko Nakao, Niihama (JP); Masafumi Yoshida, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 108 days.

(21) Appl. No.: 16/308,949

(22) PCT Filed: Jun. 12, 2017

(86) PCT No.: PCT/JP2017/021644
§ 371 (c)(1),
(2) Date: Dec. 11, 2018

(87) PCT Pub. No.: WO2017/217365
PCT Pub. Date: Dec. 21, 2017

(65) Prior Publication Data
US 2019/0309437 A1   Oct. 10, 2019

(30) Foreign Application Priority Data

Jun. 14, 2016   (JP) .................................. 2016-118376

(51) Int. Cl.
*C30B 7/08*   (2006.01)
*C30B 7/14*   (2006.01)
(Continued)

(52) U.S. Cl.
CPC ................ *C30B 7/14* (2013.01); *C01G 53/00* (2013.01); *C01G 53/006* (2013.01); *C01G 53/04* (2013.01);
(Continued)

(58) Field of Classification Search
CPC ................ C30B 7/08; C30B 7/14; C30B 9/16
See application file for complete search history.

(56) References Cited

U.S. PATENT DOCUMENTS

| | | | | |
|---|---|---|---|---|
| 5,707,764 A | * | 1/1998 | Miyamoto | ............... H01M 4/32 423/594.3 |
| 2015/0364759 A1 | | 12/2015 | Kase et al. | |

(Continued)

FOREIGN PATENT DOCUMENTS

| | | |
|---|---|---|
| EP | 2818452 | 12/2014 |
| JP | H10-125319 | 5/1998 |

(Continued)

OTHER PUBLICATIONS

Anonymous: "Chapter 9: Combustion Modeling", Apr. 7, 2016 (Apr. 7, 2016), XP055587243, Retrieved from the Internet: URL:https://www.sharcnet.ca/Software/Ansys/16.2.3/en-us/help/cfx_mod/i1365541.html [retrieved on May 9, 2019].

(Continued)

*Primary Examiner* — Robert M Kunemund
(74) *Attorney, Agent, or Firm* — IPUSA, PLLC

(57) ABSTRACT

A method for producing a nickel-containing hydroxide is provided that includes a nucleation step of generating nuclei of nickel-containing hydroxide particles by neutralization crystallization in an aqueous solution accommodated in an agitation tank. In the nucleation step, a volume fraction of a highly supersaturated region in the aqueous solution where the molar concentration of the nickel-containing hydroxide (Continued)

dissolved in the aqueous solution is greater than or equal to 5.0 mol/m$^3$ is less than 0.100% of the aqueous solution.

3 Claims, 6 Drawing Sheets

(51) Int. Cl.
*C01G 53/00* (2006.01)
*C01G 53/04* (2006.01)
*H01M 4/32* (2006.01)
*H01M 4/52* (2010.01)
*H01M 4/505* (2010.01)
*H01M 4/525* (2010.01)

(52) U.S. Cl.
CPC ............... *H01M 4/32* (2013.01); *H01M 4/52* (2013.01); *C01P 2002/52* (2013.01); *C01P 2004/03* (2013.01); *H01M 4/505* (2013.01); *H01M 4/525* (2013.01)

(56) References Cited

U.S. PATENT DOCUMENTS

| | | |
|---|---|---|
| 2015/0364761 A1 | 12/2015 | Fukui et al. |
| 2016/0036043 A1 | 2/2016 | Dai et al. |
| 2017/0012288 A1 | 1/2017 | Yamaji et al. |

FOREIGN PATENT DOCUMENTS

| | | | |
|---|---|---|---|
| JP | 2001-291515 | | 10/2001 |
| JP | 2010196118 | * | 9/2010 |
| JP | 2011-201764 | | 10/2011 |
| JP | 2014-144894 | | 8/2014 |
| JP | 2019212365 | * | 12/2019 |
| WO | 2012/169274 | | 12/2012 |
| WO | 2015/115547 | | 8/2015 |

OTHER PUBLICATIONS

International Search Report dated Jul. 25, 2017 with respect to PCT/JP2017/021644.

* cited by examiner

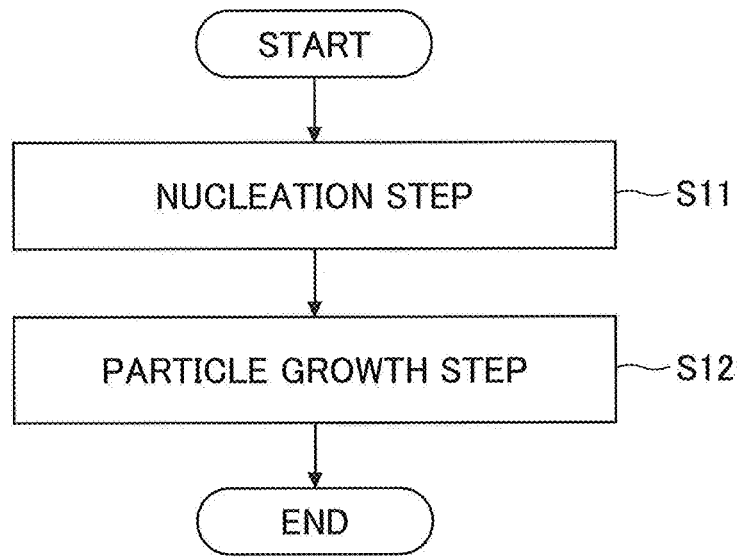
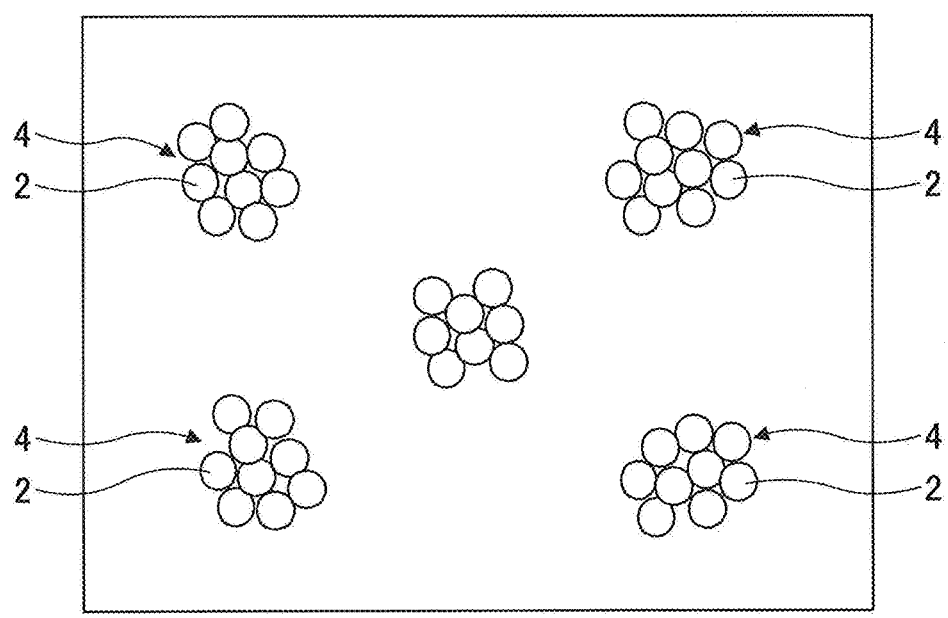

METHOD FOR PRODUCING NICKEL-CONTAINING HYDROXIDE

TECHNICAL FIELD

The present invention relates to a method for producing a nickel-containing hydroxide that is used as a precursor of the positive electrode active material of a lithium ion secondary battery.

BACKGROUND ART

In recent years, with the widespread use of portable electronic devices, such as mobile phones and notebook computers, there is a high demand for the development of small and light nonaqueous electrolyte secondary batteries having high energy density. There is also a high demand for the development of high-output secondary batteries as batteries for electric vehicles such as hybrid electric vehicles. Lithium ion batteries are nonaqueous secondary batteries that can satisfy these demands. A lithium ion secondary battery includes a negative electrode, a positive electrode, an electrolyte solution, and the like. Materials capable of sustaining lithium insertion and deinsertion are used as a negative-electrode active material and a positive electrode active material.

Lithium composite oxides, particularly, lithium-cobalt composite oxides, which are relatively easy to synthesize, are promising materials for use as the positive electrode material because lithium ion secondary batteries that use lithium composite oxides as the positive electrode material can achieve a high voltage of around 4V. As such, practical applications of lithium ion secondary batteries using lithium composite oxides are being developed as batteries having high energy density. Note that numerous efforts have been made to develop lithium ion secondary batteries using lithium-cobalt composite oxides with improved initial capacity characteristics and cycle characteristics, and various positive outcomes have been obtained therefrom.

However, because an expensive cobalt compound is used as a raw material in a lithium-cobalt composite oxide, the cost per capacity of batteries using lithium-cobalt composite oxides is substantially higher than nickel-hydrogen batteries, and as such, their applications are substantially limited. Thus, cost reduction of the positive electrode active material is desired with respect to both small secondary batteries used in portable devices and large secondary batteries for electric power storage and electric vehicles, and the development of techniques for reducing the cost of the positive electrode active material to enable production of a more inexpensive lithium ion secondary battery will have great potential and industrial significance.

An example of a potential new material to be used as the active material of a lithium ion secondary battery includes a lithium-nickel composite oxide that uses nickel, which is a cheaper alternative to cobalt. The lithium-nickel composite oxide exhibits a lower electrochemical potential as compared with the lithium-cobalt composite oxide, and as such, the lithium-nickel composite oxide may be less prone to problems of decomposition due to oxidation of the electrolyte, achieve higher capacity, and exhibit a high battery voltage comparable to that of the cobalt-based lithium ion secondary battery. As such, active research and development efforts are being made with respect to the lithium-nickel composite oxide. However, when a purely nickel-based lithium composite oxide synthesized with only nickel is used as the positive electrode active material of a lithium ion secondary battery, cycle characteristics may be degraded as compared with cobalt-based lithium ion secondary batteries. Also, such a purely-nickel-based lithium ion secondary battery may be prone to battery performance degradation when stored or used in a high temperature environment. In this respect, lithium-nickel composite oxides obtained by substituting a part of nickel with cobalt or aluminum are generally known.

A general method for producing the positive electrode active material involves (1) first, preparing a nickel composite hydroxide as a precursor of the lithium-nickel composite oxide using the so-called neutralization crystallization method, and (2) mixing the precursor with a lithium compound and firing the mixture. Of the above process steps, a representative example of process step (1) for producing particles by the neutralization crystallization method includes a process using an agitation tank.

Patent Document 1 describes a method that involves supplying a mixed aqueous solution containing a nickel salt and a cobalt salt, an aqueous solution containing an ammonium ion supplier, and a caustic alkali aqueous solution into an agitation tank and causing a reaction so that nickel-cobalt composite hydroxide particles are precipitated. Patent Document 1 describes how particles having a large particle diameter, high crystallinity, and a substantially spherical shape can be obtained by setting up the ratio of the supply amount of the mixed aqueous solution with respect to the supply amount of a reaction aqueous solution per supply port to be less than or equal to 0.04 vol %/minute.

PRIOR ART DOCUMENTS

Patent Documents

Patent Document 1: Japanese Unexamined Patent Publication No. 2011-201764

SUMMARY OF THE INVENTION

Problem to be Solved by the Invention

Various studies have been conducted to produce nickel-containing hydroxide particles having desired characteristics.

However, production conditions have to be set up each time the type or diameter of the impeller, the volume of the agitation tank, or some other structural change is made to the agitation apparatus.

Also, particles obtained at the completion of neutralization crystallization may have rough outer surfaces, and the roughness of the outer surfaces of the particles may adversely affect the characteristics of the lithium ion secondary battery.

The present invention has been made in view of the above problems of the related art, and it is an object of the present invention to provide a method for producing a nickel-containing hydroxide that can universally reduce the roughness of the outer surfaces of particles obtained at the completion of neutralization crystallization in various chemical reaction apparatuses having various structures.

Means for Solving the Problem

According to one embodiment of the present invention, a method for producing a nickel-containing hydroxide is provided that includes a nucleation step of generating nuclei of nickel-containing hydroxide particles by neutralization crystallization in an aqueous solution accommodated in an agitation tank. In the nucleation step, a volume fraction of a highly supersaturated region in the aqueous solution where the molar concentration of the nickel-containing hydroxide dissolved in the aqueous solution is greater than or equal to 5.0 mol/m$^3$ is less than 0.100% of the aqueous solution.

Advantageous Effect of the Invention

According to an aspect of the present invention, a method for producing a nickel-containing hydroxide may be provided that can universally reduce the roughness of the outer surfaces of particles obtained at the completion of neutralization crystallization in various chemical reaction apparatuses having various structures.

BRIEF DESCRIPTION OF THE DRAWINGS

FIG. 1 is a flowchart showing a method for producing a nickel-containing hydroxide according to an embodiment of the present invention;

FIG. 2 is a schematic cross-sectional view of an aggregate formed during a first half of a particle growth step according an embodiment of the present invention;

EMBODIMENTS FOR IMPLEMENTING THE INVENTION

Figure 3:
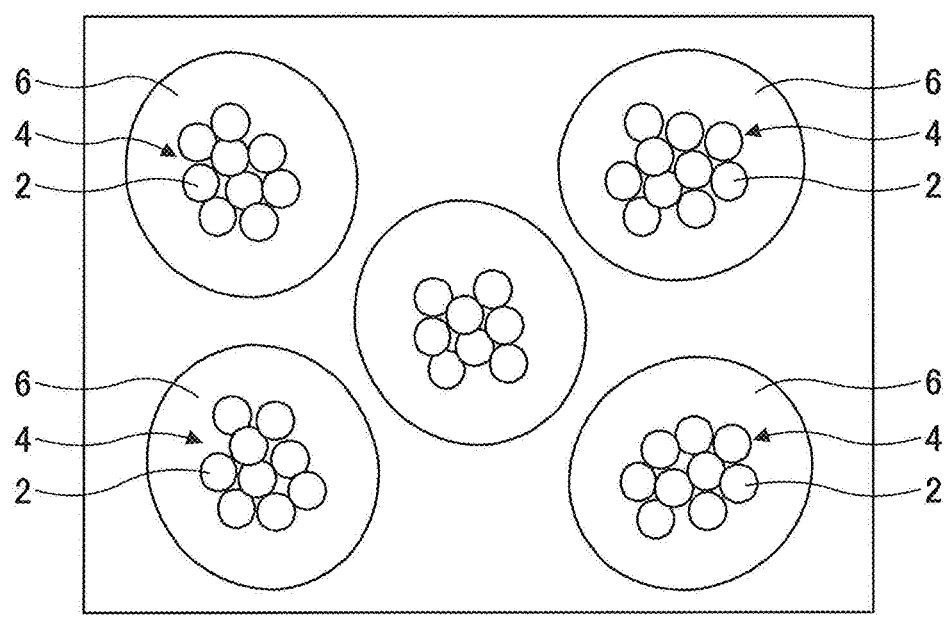
FIG. 3 is a schematic cross-sectional view of an outer shell formed during a second half of the particle growth step according to an embodiment of the present invention.

In the following, embodiments of the present invention will be described with reference to the accompanying drawings. Note that in the present description and the drawings, identical or corresponding elements are given the same reference numerals and overlapping descriptions thereof may be omitted.

FIG. 1 is a flowchart showing a method for producing a nickel-containing hydroxide according to an embodiment of the present invention. The method for producing a nickel-containing hydroxide shown in FIG. 1 is a method for obtaining nickel-containing hydroxide particles by neutralization crystallization, and includes a nucleation step S11 for generating nuclei of particles and a particle growth step S12 for promoting growth of the particles. Each of the above steps will be described below after describing the nickel-containing hydroxide to be obtained.

(Nickel-Containing Hydroxide)

The nickel-containing hydroxide is used as a precursor of the positive-electrode active material of a lithium ion secondary battery. The nickel-containing hydroxide may be (1) a nickel composite hydroxide that contains nickel (Ni), cobalt (Co), and aluminum (Al) at an amount ratio (mole ratio) of Ni:Co:Al=(1−x−y):x:y (where 0≤x≤0.3, 0.005≤y≤0.15), or (2) a nickel-cobalt-manganese composite hydroxide that contains nickel (Ni), cobalt (Co), and manganese (Mn), and element M (where M denotes at least one additional element selected from a group consisting of Ti, V, Cr, Zr, Nb, Mo, Hf, Ta, and W) at an amount ratio (mole ratio) of Ni:Co:Mn:M=x:y:z:t (where x+y+z+t=1, 0.1≤x≤0.7, 0.1≤y≤0.5, 0.1≤z≤0.8, 0≤t≤0.02), for example.

The amount of hydroxide ions included in a nickel-containing hydroxide according to one embodiment may normally have a stoichiometric ratio, but the amount of hydroxide ions may be excessive or deficient to the extent that no substantial influence is cast on the present embodiment. Also, a part of the hydroxide ions may be replaced with anions (e.g., carbonate ions, sulfate ions, etc.) to the extent that no substantial influence is cast on the present embodiment.

The nickel-containing hydroxide according to one embodiment may be a single phase of a nickel-containing hydroxide (or substance primarily containing a nickel-containing hydroxide) as measured by X-ray diffraction (XRD).

The nickel-containing hydroxide contains nickel, and preferably further contains a metal other than nickel. A nickel-containing hydroxide further containing a metal other than nickel will be referred to as a nickel composite hydroxide. Because the metal composition ratio of the nickel composite hydroxide (e.g., Ni:Co:Mn:M) will be maintained even in the positive electrode active material to be obtained, the metal composition ratio of the nickel composite hydroxide is preferably adjusted to match the desired metal composition ratio of the positive electrode active material.

(Method for Producing Nickel-Containing Hydroxide)

As described above, the method for producing a nickel-containing hydroxide includes a nucleation step S11 and a particle growth step S12. In the present embodiment, the nucleation step S11 and the particle growth step S12 are carried out separately by using a batch agitation tank and controlling the pH value of the aqueous solution in the agitation tank, for example.

In the nucleation step S11, nucleation takes precedence over particle growth and particle growth hardly occurs. On the other hand, in the particle growth step S12, particle growth takes precedence over nucleation and new nuclei are hardly generated. By performing the nucleation step S11 and the particle growth step S12 separately, homogenous nuclei with a narrow particle size distribution range may be formed, and the nuclei may be homogenously grown thereafter.

In the following, the nucleation step S11 and the particle growth step S12 will be described. Note that the pH value range of the aqueous solution in the agitation tank during the nucleation step S11 and the pH value range of the aqueous solution in the agitation tank during the particle growth step S12 are different, but the ammonia concentration range and the temperature range of the aqueous solution may be substantially the same.

Note that although a batch agitation tank is used in the present embodiment, a continuous agitation tank may be used as well. When a continuous agitation tank is used, the nucleation step S11 and the particle growth step S12 are carried out at the same time. In this case, the pH value range of the aqueous solution in the agitation tank will naturally be the same and may be in a range around 12.0, for example.

(Nucleation Step)

First, a raw material liquid is prepared. The raw material liquid contains at least a nickel salt, and preferably further contains a metal salt other than the nickel salt. The metal salt may be a nitrate, a sulfate, a hydrochloride, or the like. More specifically, for example, nickel sulfate, manganese sulfate, cobalt sulfate, aluminum sulfate, titanium sulfate, ammonium peroxotitanate, potassium titanium oxalate, vanadium sulfate, ammonium vanadate, chromium sulfate, potassium chromate, zirconium sulfate, zirconium nitrate, niobium oxalate, ammonium molybdate, hafnium sulfate, sodium tantalate, sodium tungstate, ammonium tungstate, and the like may be used as the metal salt.

Because the metal composition ratio of the raw material liquid (e.g., Ni:Co:Mn:M) is maintained even in the nickel composite hydroxide to be obtained, the metal composition ratio of the raw material liquid is adjusted to match the desired metal composition ratio of the nickel composite hydroxide.

Also, a mixed aqueous solution obtained by supplying and mixing an alkaline aqueous solution, an aqueous ammonia solution, and water is stored in an agitation tank. The mixed aqueous solution is hereinafter referred to as "pre-reaction aqueous solution". The pH value of the pre-reaction aqueous solution is adjusted to be within the range from 12.0 to 14.0, and preferably within the range from 12.3 to 13.5, at a liquid temperature of 25° C. as the reference temperature. Also, the concentration of ammonia in the pre-reaction aqueous solution is preferably adjusted to be within the range from 3 g/L to 25 g/L, more preferably within the range from 5 g/L to 20 g/L, and more preferably within the range from 5 g/L to 15 g/L. Further, the temperature of the pre-reaction aqueous solution is preferably adjusted to be within the range from 20° C. to 60° C., and more preferably within the range from 35° C. to 60° C.

The alkaline aqueous solution may be an aqueous solution containing an alkali metal hydroxide such as sodium hydroxide, potassium hydroxide, or the like. The alkali metal hydroxide may be supplied as a solid but is preferably supplied as an aqueous solution.

The ammonia aqueous solution may be an aqueous solution containing an ammonia supplier. The ammonia supplier may be, for example, ammonia, ammonium sulfate, ammonium chloride, ammonium carbonate, ammonium fluoride, or the like.

Note that in the present embodiment, an ammonia supplier is used as a non-reducing complexing agent. However, in other embodiments, ethylenediaminetetraacetic acid, nitrito triacetic acid, uracil diacetic acid, glycine, or the like may be used, for example. That is, any non-reducing complexing agent that is capable of bonding with a nickel ion or the like to form a complex in an aqueous solution accommodated in an agitation tank may be used.

After adjusting the pH value, the ammonia concentration, the temperature, and the like of the pre-reaction aqueous solution, the raw material liquid is supplied into the agitation tank while agitating the pre-reaction aqueous solution. In this way, the pre-reaction aqueous solution and the raw material liquid may be mixed together to form a reaction aqueous solution in the agitation tank, and the nucleation step S11 of generating nuclei by neutralization crystallization may be started.

In the nucleation step S11, when the pH value of the reaction aqueous solution is greater than or equal to 12.0, nucleation takes precedence over particle growth. Also, in the nucleation step S11, when the pH value of the reaction aqueous solution is less than or equal to 14.0, the nuclei may be prevented from becoming too fine, and gelation of the reaction aqueous solution may be prevented. In the nucleation step S11, the fluctuation range (the range between the maximum value and the minimum value) of the pH value of the reaction aqueous solution is preferably less than or equal to 0.4.

Also, in the nucleation step S11, when the ammonia concentration in the reaction aqueous solution is greater than or equal to 3 g/L, the solubility of metal ions may be kept constant and generation of nuclei with accurate shapes and particle diameters may be promoted. Also, in the nucleation step S11, when the ammonia concentration in the reaction aqueous solution is less than or equal to 25 g/L, the amount of metal ions remaining in the aqueous solution without precipitating may be reduced and production efficiency may be improved. In the nucleation step S11, the fluctuation range (the range between the maximum value and the minimum value) of the ammonia concentration of the reaction aqueous solution is preferably less than or equal to 5 g/L.

Also, in the nucleation step S11, when the temperature of the reaction aqueous solution is greater than or equal to 20° C., the nickel-containing hydroxide may be substantially soluble in the reaction aqueous solution such that nucleation may be gradual and nucleation may be easily controlled. Also, when the temperature of the reaction aqueous solution is less than or equal to 60° C., volatilization of ammonia may be prevented so that the amount of ammonia water used may be reduced and production costs may be reduced.

In the nucleation step S11, an alkaline aqueous solution and an ammonia aqueous solution are supplied to the agitation tank in addition to the raw material liquid so that the pH value, the ammonia concentration, and the temperature of the reaction aqueous solution can be maintained within the above ranges. In this way, nucleation may be continued in the reaction aqueous solution. After a predetermined amount of nuclei are generated, the nucleation step S11 is ended. Note that whether the predetermined amount of nuclei has been generated can be estimated based on the amount of metal salt supplied.

(Particle Growth Step)

After completing the nucleation step S11 and before starting the particle growth step S12, the pH value of the reaction aqueous solution in the agitation tank is adjusted to be lower than the pH value of the reaction aqueous solution during the nucleation step S11 and is adjusted to be within the range from 10.5 to 12.0, and more preferably within the range from 11.0 to 12.0, at a liquid temperature of 25° C. as the reference temperature. The pH value may be adjusted by stopping the supply of the alkaline aqueous solution into the agitation tank, or supplying an inorganic acid having the metal of metal salt replaced with hydrogen (e.g., sulfuric acid in the case where the metal salt is a sulfate) into the agitation tank, for example.

After adjusting the pH value, the ammonia concentration, the temperature, and the like of the reaction aqueous solution, the raw material liquid is supplied into the agitation tank while agitating the reaction aqueous solution. In this way, the nuclei may start growing (particle growth) through neutralization crystallization, and the particle growth step S12 may be started. Note that although the nucleation step S11 and the particle growth step S12 are carried out in the same agitation tank in the present embodiment, the above steps may also be performed in different agitation tanks.

In the particle growth step S12, when the pH value of the reaction aqueous solution is less than or equal to 12.0 and is lower than the pH value of the reaction aqueous solution during the nucleation step S11, new nuclei are hardly generated and particle growth takes precedence over nucleation.

Note that when the pH value of the reaction aqueous solution is 12.0, the reaction aqueous solution is at a boundary condition between nucleation and particle growth, and as such, whether nucleation or particle growth will take precedence depends on the presence or absence of nuclei in the reaction aqueous solution. For example, when the pH value of the reaction aqueous solution during the nucleation step S11 is adjusted to be higher than 12.0 to promote the generation of a large amount nuclei, and the pH value of the reaction aqueous solution is thereafter adjusted to 12.0 for the particle growth step S12, particle growth will take precedence because a large amount of nuclei are present in the reaction aqueous solution. On the other hand, when nuclei are not present in the aqueous reaction solution, i.e., when the pH value of the reaction aqueous solution during the nucleation step S11 is adjusted to 12.0, nucleation will take precedence because there are no nuclei to be grown. Thereafter, when the pH value of the reaction aqueous solution is adjusted to be less than 12.0 for the particle growth step S12, the generated nuclei may be grown. In order to clearly separate nucleation and particle growth, the pH value in the particle growth step is preferably adjusted to be lower than the pH value in the nucleation step by a difference of at least 0.5, and more preferably by a difference of at least 1.0.

Also, when the pH value of the reaction aqueous solution is greater than or equal to 10.5 in the particle growth step S12, metal ions remaining in the solution without precipitation may be reduced owing to their low solubility in ammonium, and production efficiency may be improved.

In the particle growth step S12, an alkaline aqueous solution and an ammonia aqueous solution are supplied into the agitation tank in addition to the raw material liquid so that the pH value, the ammonia concentration, and the temperature of the reaction aqueous solution may be maintained within the above ranges. In this way, particle growth may be continued in the reaction aqueous solution.

The particle growth step S12 can be divided into a first half and a second half by switching the atmosphere in the agitation tank. In the first half of the particle growth step, the atmosphere is an oxidizing atmosphere similar to that in the nucleation step S11. The oxygen concentration in the oxidizing atmosphere is greater than or equal to 1 vol %, more preferably greater than or equal to 2 vol %, and more preferably greater than or equal to 10 vol %. The oxidizing atmosphere may be an ambient air atmosphere (oxygen concentration: 21 vol %), which is easy to control, for example. The upper limit of the oxygen concentration of the oxidizing atmosphere is not particularly limited but may be less than or equal to 30 vol %, for example. On the other hand, in the second half of the particle growth step, the atmosphere is switched to a non-oxidizing atmosphere. The oxygen concentration in the non-oxidizing atmosphere is less than or equal to 1 vol %, more preferably less than or equal to 0.5 vol %, and more preferably less than or equal to 0.3 vol %. The oxygen concentration in the non-oxidizing atmosphere may be controlled by mixing oxygen gas or ambient air and an inert gas, for example.

FIG. 2 is a schematic cross-sectional view of an aggregate formed in the first half of the particle growth step according to an embodiment of the present invention. FIG. 3 is a schematic cross-sectional view of an outer shell formed in the second half of the particle growth step according to an embodiment of the present invention.

In the first half of the particle growth step S12, seed crystal particles 2 are formed by promoting growth of nuclei, and as the seed crystal particles 2 increase in size, the seed crystal particles 2 start to collide with each other to form an aggregate 4 made up of a plurality of the seed crystal particles 2. On the other hand, in the second half of the particle growth step S12, a fine outer shell 6 is famed around the aggregate 4. As a result, particles each made up of the aggregate 4 and the outer shell 6 are obtained.

Note that the structure of the nickel-containing hydroxide particle is not limited to the structure shown in FIG. 3. For example, when the nucleation step S11 and the particle growth step S12 are performed at the same time, the particle structure obtained upon completion of neutralization crystallization may be a different structure from the particle structure shown in FIG. 3. For example, structures corresponding to the seed crystal particles 2 and structures corresponding to the outer shells 6 may be merged and less distinguishable such that a more undifferentiated structure may be obtained.

The particle growth step S12 is ended at the time the nickel-containing hydroxide particles have grown to a predetermined particle diameter. The particle diameter of the nickel-containing hydroxide particles may be estimated based on the amount of metal salt supplied in the nucleation step S11 and the particle growth step S12.

Note that after the nucleation step S11 and during the particle growth step S12, the supply of the raw material liquid may be stopped and the agitation of the reaction aqueous solution may be stopped to cause the particles to settle and to discharge the supernatant liquid above the settled particles. In this way, the metal ion concentration in the reaction aqueous solution may be increased after the metal ion concentration has decreased by neutralization crystallization.

Figure 4:
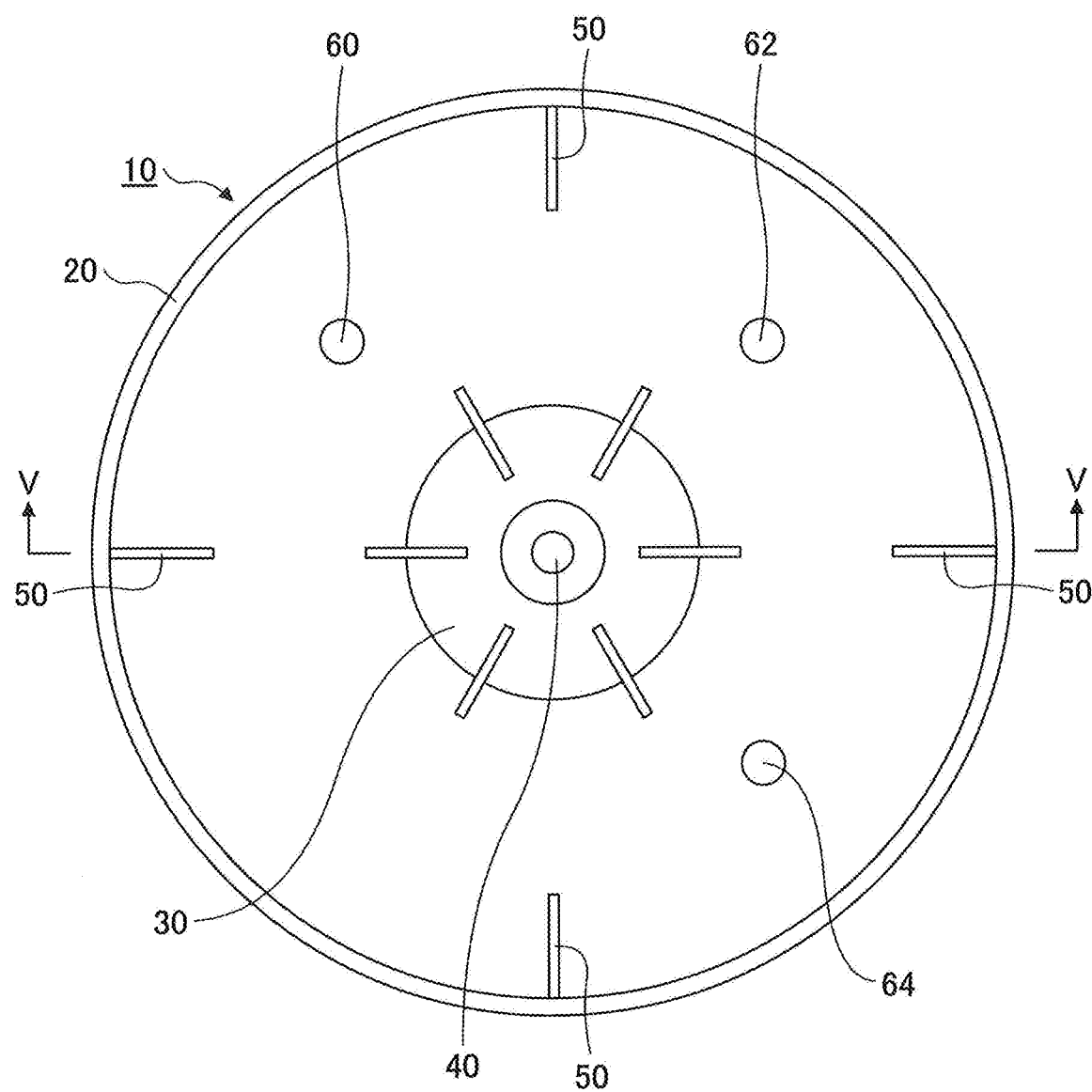
FIG. 4 is a top view of a chemical reaction apparatus used to implement the method for producing a nickel-containing hydroxide according to an embodiment of the present invention.
Figure 5:
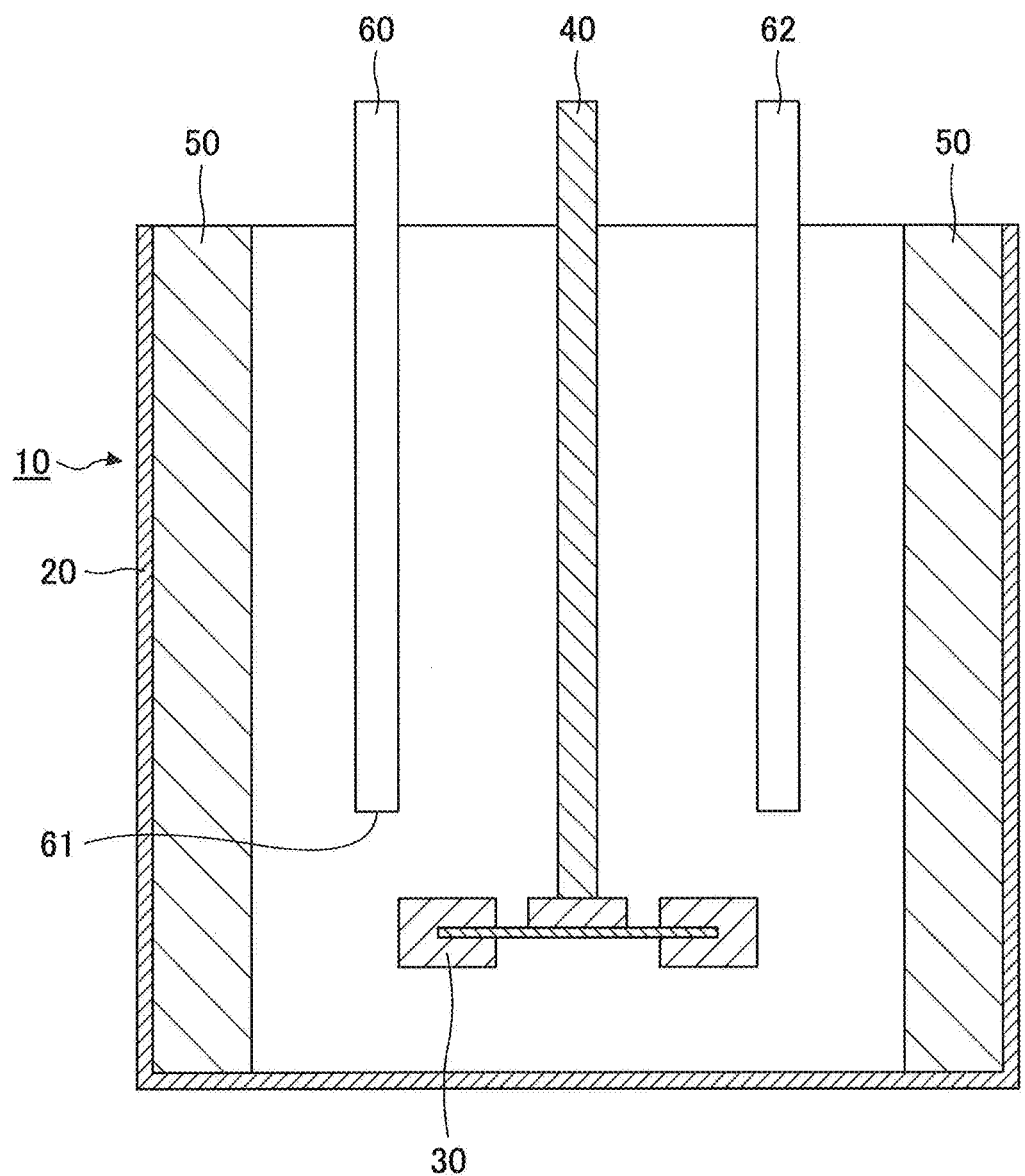
FIG. 5 is a cross-sectional view of the chemical reaction apparatus across line V-V of FIG. 4.

FIG. 4 is a top view of a chemical reaction apparatus 10 that is used to implement the method for producing a nickel-containing hydroxide according to an embodiment of the present invention. FIG. 5 is a cross-sectional view of the chemical reaction apparatus across line V-V of FIG. 4.

The chemical reaction apparatus 10 includes an agitation tank 20, an impeller 30, a shaft 40, and a baffle 50. The agitation tank 20 accommodates a reaction aqueous solution in a cylindrical inner space. The impeller 30 agitates the aqueous reaction solution in the agitation tank 20. The impeller 30 is attached to the lower end of the shaft 40. The impeller 30 may be rotated by rotating the shaft 40 with a motor or the like. The center line of the agitation tank 20, the center line of the impeller 30, and the center line of the shaft 40 may coincide and may be vertical. The baffle 50 is also referred to as a baffle plate. The baffle 50 protrudes from the inner peripheral surface of the agitation tank 20, and generates an upward flow and a downward flow by interfering with a rotating flow, thereby improving agitation efficiency of the reaction aqueous solution.

Also, the chemical reaction apparatus 10 includes a raw material liquid supply pipe 60, an alkaline aqueous solution supply pipe 62, and an ammonia water supply pipe 64. The raw material liquid supply pipe 60 supplies the raw material liquid into the agitation tank 20. The alkaline aqueous solution supply pipe 62 supplies an alkaline aqueous solution into the agitation tank 20. The ammonia water supply pipe 64 supplies ammonia water into the agitation tank 20.

The inventors of the present invention have investigated the condition for universally reducing the roughness of the outer surfaces of particles obtained at the completion of neutralization crystallization in various chemical reaction apparatuses having various structures and have directed their focus on the volume fraction of a highly supersaturated region 12 (see FIG. 6) in the reaction aqueous solution accommodated in the agitation tank 20 during the nucleation step S11.

Figure 6:
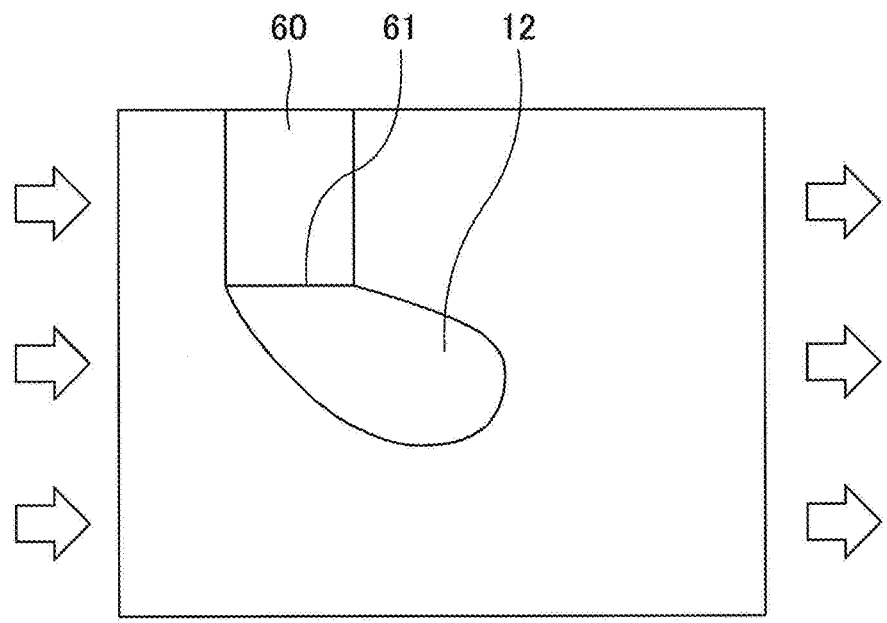
FIG. 6 is a diagram showing a highly supersaturated region in a reaction aqueous solution during a nucleation step according to an embodiment of the present invention.

FIG. 6 is a diagram showing a highly supersaturated region in the reaction aqueous solution during the nucleation step according to an embodiment of the present invention. Note that the arrows in FIG. 6 represent the direction of flow in the vicinity of a supply port 61 of the raw material liquid supply pipe 60.

The highly supersaturated region 12 refers to a region in the reaction aqueous solution where the molar concentration of the nickel-containing hydroxide dissolved in the reaction aqueous solution is greater than or equal to 5.0 mol/m$^3$. In the highly supersaturated region 12, the nickel-containing hydroxide is dissolved at a sufficiently higher molar concentration than its solubility, and as such, nucleation occurs at a significant rate.

Note that the solubility of the nickel-containing hydroxide refers to the maximum amount of the nickel-containing hydroxide soluble in 100 g of water (g/100 g-H$_2$O). For example, the solubility of nickel hydroxide (Ni(OH)$_2$) is 10$^{-7}$ (g/100 g-H$_2$O). As can be appreciated, the solubility of the nickel-containing hydroxide is close to zero, and the concentration of the nickel-containing hydroxide at solubility is so low as to be negligible as compared to 5.0 mol/m$^3$, which is the minimum molar concentration of the nickel-containing hydroxide in the highly supersaturated region 12.

The highly supersaturated region 12 is formed in the vicinity of the supply port 61 of the raw material liquid supply pipe 60. The supply port 61 is provided in the flow field of the reaction aqueous solution, and as such, the volume of the highly supersaturated region 12 is influenced by the flow field. The flow field varies depending on the rotation speed of the impeller 30 as well as the type of the impeller 30, the impeller diameter, the volume of the agitation tank 20, and the like.

Note that although only one supply port 61 is shown in FIGS. 4 to 6, in some embodiments, a plurality of supply ports 61 may be used, and a plurality of highly supersaturated regions 12 may be formed, for example. When a plurality of highly supersaturated regions 12 is formed, the volume of the highly supersaturated region 12 corresponds to the total volume of the plurality of highly supersaturated regions 12.

In the nucleation step S11, nuclei are generated primarily in the highly supersaturated region 12, and the generated nuclei are then dispersed throughout the reaction aqueous solution. When the volume fraction of the highly supersaturated region 12 is less than 0.100% of the entire reaction aqueous solution, the number of nuclei generated per unit volume in the reaction aqueous solution will be a relatively small number. As such, the number of seed crystal particles 2 generated per unit volume in the aqueous solution during the first half of the particle growth step S12 will be a relatively small number, and the number of aggregates 4 famed by a plurality of seed crystal particles 2 will also be a relatively small number. As a result, the outer shells 6 formed around the aggregates 4 in the second half of the particle growth step S12 may become relatively thick.

The thickening of the outer shells 6 may be attributed to the fact that the proportion of the material for forming the outer shell 6 supplied per aggregate 4 varies depending on the number of aggregates 4 that are present as growth starting points for the outer shells 6; i.e., whether a small number of aggregates 4 or a large number of aggregates 4 are present. When a small number of aggregates 4 are present, the proportion of the material for forming the outer shell 6 supplied per aggregate 4 is higher as compared with the case where a large number of aggregates 4 are present. As such, when a small number of aggregates 4 are present, the outer shells 6 of the individual aggregates 4 can be thickened.

Thus, by controlling the volume fraction of the highly supersaturated region 12 in the reaction aqueous solution to be less than 0.100% of the entire reaction aqueous solution to reduce the number of nuclei generated, the rough outer surfaces of the aggregates 4 may be covered with thick outer shells 6 such that the roughness of the outer surfaces of the particles that are ultimately obtained may be reduced. Note that such an effect may be obtained even when the nucleation step S11 and the particle growth step S12 are performed at the same time.

In terms of reducing the roughness of the outer surfaces of particles obtained at the completion of neutralization crystallization, the volume fraction of the highly supersaturated region 12 in the reaction aqueous solution is preferably arranged to be as small as possible. The volume fraction of the highly supersaturated region 12 depends on factors such as a flow field velocity U in the vicinity of the supply port 61, a turbulent flow diffusion coefficient K, and the like. That is, the larger the flow field velocity U or the turbulent flow diffusion coefficient K, the smaller the volume fraction of the highly supersaturated region 12. The volume fraction of the highly supersaturated region 12 is preferably less than or equal to 0.070%, more preferably less than or equal to 0.050%, and more preferably less than or equal to 0.030%. However, because the flow field velocity U and the turbulent flow diffusion coefficient K are restricted by the capacity of the motor for rotating the shaft 40 and the like, the volume fraction of the highly supersaturated region 12 is preferably greater than or equal to 0.004%.

The volume of the highly supersaturated region 12 can be obtained by simulation using general-purpose fluid analysis software.

In the following, an example steady state fluid analysis in the case of producing nickel hydroxide by reacting nickel sulfate and sodium hydroxide in a continuous agitation tank will be mainly described. Note that the fluid analysis software used in the following example is ANSYS CFX Ver 15.0 (product name) manufactured by ANSYS Co., Ltd. The analysis conditions and the like are described below.

<Coordinate System>

A region around the shaft and the impeller from among the regions to be analyzed in the fluid analysis (hereinafter also referred to as "analysis region") is covered by a rotating coordinate system that rotates along with the shaft and the impeller. The region to be covered by the rotating coordinate system is cylindrical, its center line is arranged to coincide with the center lines of the shaft and the impeller, its diameter is set to 115% of the diameter of the impeller, and its range in the vertical direction extends from the inner bottom surface to the liquid surface of the agitation tank.

Other regions of the analysis region are covered by a stationary coordinate system.

The rotating coordinate system and the stationary coordinate system are connected using an interface function of the fluid analysis software. Note that the optional setting "Frozen Rotor" is used as the interface function of the fluid analysis software.

<Turbulence Model>

The flow in the agitation tank is a turbulent flow rather than a laminar flow. Specifically, the SST (Shear Stress Transport) turbulence model is used as the turbulence model of the flow.

<Chemical Reaction>

The chemical reaction that occurs in the agitation tank may be represented by the following formulae:

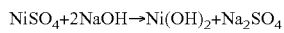

In the fluid analysis, a single-phase multi-component fluid that contains the following five components is analyzed.
1) Reactant component A: $NiSO_4$
2) Reactant component B: NaOH
3) Product component C: $Ni(OH)_2$
4) Product component D: $Na_2SO_4$
5) Water The rate of the chemical reaction is calculated by the eddy dissipation model. The eddy dissipation model is a reaction model that assumes that the above chemical reaction occurs when the reactant component A and the reactant component B are mixed to the molecular level by turbulence dispersion. The settings of the eddy dissipation model are left as is to the default settings of the fluid analysis software.

<Calculation of Mass Fraction of Each Component>

The total mass fraction of the above five components at a given time point and a given position in the analysis region is equal to one. As such, the mass fraction of each of the four components other than water from among the above five components is obtained by solving the transport equation by CFX, and the mass fraction of water is obtained by subtracting the total mass fraction of the above four components from one.

<Boundary Condition>

Wall Boundary (Boundary with No Fluid Flow)

It is assumed that no slip occurs at boundaries with solid surfaces such as the agitation tank, the shaft, the impeller, the baffle, and the like. On the other hand, it is assumed that slips occur at the boundary with the outside air (liquid surface). Note that that the liquid surface is assumed to be a flat surface with a constant height that is not deformed by agitation.

Inflow Boundary (Boundary where Fluid Enters)

An inflow boundary where an aqueous solution containing the reactant component A (hereinafter referred to as "aqueous solution A") flows into the fluid in the agitation tank and an inflow boundary where an aqueous solution containing the reactant component B (hereinafter referred to as "aqueous solution B") flows into the fluid in the agitation tank are separately provided.

It is assumed that the inflow rate of the aqueous solution A, the proportion of the reactant component A in the aqueous solution A, the inflow rate of the aqueous solution B, and the proportion of the reactant component B in the aqueous solution B are constant. The inflow rate of the aqueous solution B is set up so that the pH value of the aqueous solution in the agitation tank is maintained at a predetermined value (e.g., 12.0).

Outflow Boundary (Boundary where Fluid Flows Out)

An outflow boundary where the fluid in the agitation tank flows out is provided on a part of the inner peripheral surface of the agitation tank. The outflowing liquid contains the product components C and D, the unreacted reactant components A and B, and water. The outflow rate of the outflowing liquid is set up so that the pressure difference between the analysis region and a region outside the system becomes zero.

Note that in a case where an overflow type continuous system is used, the liquid surface corresponds to the outflow boundary.

<Thermal Condition>

The temperature of the fluid in the agitation tank is maintained constant at 25° C. It is assumed that heat generation by the chemical reaction and heat input/output at the inflow boundary and the outflow boundary do not occur.

<Initial Condition>

The fluid in the agitation tank, in its initial state, is assumed to be homogeneous and contains only two components out of the above five components, i.e., the reactant component B and water. Specifically, the initial mass fraction of the reactant component A, the initial mass fraction of the product component C, the initial mass fraction of the product component D in the fluid in the agitation tank at the initial stage are zero, and the initial mass fraction of the reactant component B is set up so that the pH value of the aqueous solution in the agitation tank will be at the above predetermined value.

Note that although the initial mass fraction of the product component C and the initial mass fraction of the product component D are set to zero in the present example, in order to reduce the number of iterative calculations (i.e., calculation time) for obtaining a steady state solution, the initial mass fraction may alternatively be set to the average value for the entire analysis region that is estimated to be reached in a steady state, for example. The average value for the entire analysis region may be calculated based on the inflow rate of the aqueous solution A, the proportion of the reactant component A in the aqueous solution A, the inflow rate of the aqueous solution B, the proportion of the reactant component B in the aqueous solution B, the quantitative relationship expressed by the chemical reaction formula, and the like.

<Convergence Determination>

The iterative calculations for obtaining a steady state solution are performed until the root mean square errors of the flow velocity component (m/s) of the flow, the pressure (Pa), and the mass fractions of the above four components at a given position in the analysis region become less than or equal to $10^{-4}$.

<Calculation of Volume of Highly Supersaturated Region>

The highly supersaturated region is a region where the concentration of the product component C dissolved in the aqueous solution in the agitation tank is greater than or equal to 5.0 mol/m³. The highly supersaturated region is formed around the inflow boundary of the aqueous solution A.

Note that in the fluid analysis, as described above, the above five components are treated as a single-phase multi-component fluid, and as such, all of the product component C contained therein is treated as a liquid. However, in reality, most of the product component C is precipitated into a solid, and only the remaining part of the product component C is dissolved in the aqueous solution as a liquid.

Accordingly, the volume of the highly supersaturated region is calculated by correcting the concentration distribution of the product component C obtained by the fluid analysis. The correction involves uniformly decreasing the concentration of the product component C across the entire fluid in the agitation tank by a predetermined value so that the concentration of the product component C at the outflow boundary that is sufficiently far from the inflow boundary of the aqueous solution A will be equivalent to the solubility of the product component C.

Note that in the case where a batch agitation tank is used as opposed to a continuous agitation tank, no outflow boundary is present. In this case, correction of the concentration distribution may involve uniformly decreasing the concentration of the product component C across the entire fluid in the agitation tank by a predetermined value so that the concentration of the product component C at the liquid surface of the aqueous solution in the agitation tank will be equivalent to the solubility of the product component C. Also, in the case where an overflow type continuous agitation tank is used, the liquid surface corresponds to the outflow boundary.

Note that although analysis conditions for obtaining a nickel hydroxide are described above, analysis conditions for obtaining a nickel composite hydroxide can be similarly set up. For example, in the case of obtaining a nickel-manganese composite hydroxide by reacting nickel sulfate and manganese sulfate with sodium hydroxide, the fluid analysis involves analyzing a single-phase multi-component fluid that contains the following seven components.

1) Reactant component A1: $NiSO_4$
2) Reactant component A2: $MnSO_4$
3) Reactant component B: NaOH
4) Product component C1: $Ni(OH)_2$
5) Product component C2: $Mn(OH)_2$
6) Product component D: $Na_2SO_4$
7) Water In the above example, it is assumed that two chemical reactions, i.e., "A1+2B C1+D" and "A2+2B→C2+D" occur in the agitation tank, and an eddy dissipation model corresponding to each chemical reaction is used as a reaction model. The reactant component A1 and the reactant component A2 are uniformly dissolved in water and supplied from the same inflow boundary. That is, an aqueous solution A containing both the reactant component A1 and the reactant component A2 is supplied from the inflow boundary. A highly supersaturated region is famed around the inflow boundary of the aqueous solution A. The highly supersaturated region refers to a region where the total molar concentration of all the metal hydroxides (product component C1 and product component C2 in the present example) from among the product components dissolved in the aqueous solution in the agitation tank is greater than or equal to 5.0 mol/$m^3$.

The reason for totaling the molar concentrations of all the metal hydroxides from among the product components will be described below. First, as described above, the reactant component A1 and the reactant component A2 that are uniformly dissolved in water flow into the agitation tank from the same inflow boundary. At this time, the reactant component A1 and the reactant component A2 promptly react with the reactant component B to produce the product component C1 and the product component C2. Thus, the product component C1 and the product component C2 are sufficiently mixed together at the time they are generated. As a result, the product component C1 and the product component C2 do not precipitate as individual hydroxides, but instead, a hydroxide of a composite of the product component C1 and the product component C2 precipitates as a solid solution.

Also, for example, in the case of obtaining a nickel composite hydroxide that contains nickel, cobalt, and aluminum using nickel sulfate, cobalt sulfate, and aluminum sulfate, the fluid analysis involves analyzing a single-phase multi-component fluid that contains the following nine components.

1) Reactant component A1: $NiSO_4$
2) Reactant component A2: $CoSO_4$
3) Reactant component A3: $Al_2(SO4)_3$
4) Reactant component B: NaOH
5) Product component C1: $Ni(OH)_2$
6) Product component C2: $Co(OH)_2$
7) Product component C3: $Al(OH)_3$
8) Product component D: $Na_2SO_4$
9) Water In the above example, it is assumed that three chemical reactions, i.e., "A1+2B→C1+D", "A2+2B→C2+D", and "1/2A3+3B→C3+3/2D" occur in the agitation tank, and an eddy dissipation model corresponding to each chemical reaction is used as a reaction model. The reactant component A1, the reactant component A2, and the reactant component A3 are uniformly dissolved in water and supplied from the same inflow boundary. That is, an aqueous solution A containing the reactant component A1, the reactant component A2, and the reactant component A3 is supplied from the inflow boundary. A highly supersaturated region is formed around the inflow boundary of the aqueous solution A. The highly supersaturated region refers to a region where the total molar concentration of all the metal hydroxides (product component C1, product component C2, and product component C3 in the present example) from among the product components dissolved in the aqueous solution in the agitation tank is greater than or equal to 5.0 mol/$m^3$.

The reason for totaling the molar concentrations of all the metal hydroxides from among the product components will be described below. First, as described above, the reactant component A1, the reactant component A2, and the reactant component A3 that are uniformly dissolved in water flow into the agitation tank from the same inflow boundary. At this time, the reactant component A1, the reactant component A2, and the reactant component A3 promptly react with the reactant component B to produce the product component C1, the product component C2, and the product component C3. Thus, the product component C1, the product component C2, and the product component C3 are sufficiently mixed together at the time they are generated. As a result, the product component C1, the product component C2, and the product component C3 do not precipitate as individual hydroxides, but instead, a hydroxide of a composite of the product component C1, the product component C2, and the product component C3 precipitates as a solid solution.

Further, for example, in the case of obtaining a nickel-cobalt-manganese composite hydroxide using nickel sulfate, manganese sulfate, and cobalt sulfate, the fluid analysis involves analyzing a single-phase multicomponent fluid that contains the following nine components.

1) Reactant component A1: $NiSO_4$
2) Reactant component A2: $MnSO_4$
3) Reactant component A3: $CoSO_4$
4) Reactant component B: NaOH
5) Product component C1: $Ni(OH)_2$
6) Product component C2: $Mn(OH)_2$
7) Product component C3: $Co(OH)_2$
8) Product Component D: $Na_2SO_4$
9) Water In the above example, it is assumed that three chemical reactions, i.e., "A1+2B→C1+D", "A2+2B→C2+D", and "1/2A3+3B→C3+3/2D" occur in the agitation tank, and an eddy dissipation model corresponding to each chemical reaction is used as a reaction model. The reactant component A1, the reactant component A2, and the reactant component A3 are uniformly dissolved in water and supplied from the same inflow boundary. That is, an aqueous solution A containing the reactant component A1, the reactant component A2, and the reactant component A3 is supplied from the inflow boundary. A highly supersaturated region is famed around the inflow boundary of the aqueous solution A. The highly supersaturated region refers to a region where the total molar concentration of all the metal hydroxides (product component C1, product component C2, and product component C3 in the present example) from among the product components dissolved in the aqueous solution in the agitation tank is greater than or equal to 5.0 mol/m$^3$.

The reason for totaling the molar concentrations of all the metal hydroxides from among the product components is similar to the above-described reason for totaling the molar concentrations of all the metal hydroxides from among the product components in the case of obtaining the nickel composite hydroxide containing nickel, cobalt, and aluminum, and as such, a description thereof will be omitted.

Note that in some embodiments, a plurality of inflow boundaries for the aqueous solution A may be provided, and a plurality of highly supersaturated regions may exist. In the case where a plurality of highly supersaturated regions exists, the volume of the highly supersaturated region corresponds to the total volume of all the highly supersaturated regions.

The method for producing a nickel-containing hydroxide may include a step of confirming by simulation that the volume fraction of the highly supersaturated region in the aqueous solution accommodated in the agitation tank during the nucleation step is less than 0.100% of the entire aqueous solution. Such a confirmation may be made each time a production condition is changed. Changing a production condition may include, for example, changing the capacity or shape of the agitation tank; changing the number, shape, size, or installation location of the impeller; changing the rotation speed of the impeller; changing the flow rate or concentration of the raw material liquid; or changing the shape, the number, or the location of nozzles for supplying the raw material liquid. For example, in the case of using a batch agitation tank, the confirmation may only need to be made once under the same production conditions; that is, the continuation does not have to be made every time production is performed as long as the production conditions are not changed.

Note that the actual reaction aqueous solution also contains ammonia as a chemical component. However, ammonia is not directly involved in the precipitation reaction of solid particles, and its concentration is also lower than the concentration of nickel hydroxide. As such, it may be presumed that the influence of ammonia on the volume of the highly supersaturated region of nickel hydroxide is small. Thus, ammonia, as one of chemical components to be solved in the simulation model, is treated as water.

EXAMPLES

Example 1

In Example 1, a nucleation step of generating nuclei of nickel composite hydroxide particles by neutralization crystallization and a particle growth step of promoting growth of the particles were carried out at the same time using an overflow type continuous agitation tank.

The volume of the agitation tank was 200 L, a disk-blade turbine impeller was used, the impeller had six blades, the diameter of the impeller was 250 mm, the vertical distance between the impeller and the inner bottom surface of the agitation tank was 140 mm, and the rotation speed of the impeller was set to 280 rpm.

The agitation tank was filled with 200 L of the reaction aqueous solution, the pH value of the reaction aqueous solution was 11.3, the ammonia concentration of the reaction aqueous solution was 12 g/L, and the temperature of the reaction aqueous solution was maintained at 50° C. The atmosphere around the reaction aqueous solution was arranged to be an ambient air atmosphere.

The raw material liquid was prepared so that a nickel composite hydroxide with the formula $Ni_{0.82}Co_{0.15}Al_{0.03}(OH)_2$ could be obtained. One raw material liquid supply pipe was provided, and the feed rate of the raw material liquid supplied from one raw material liquid supply pipe was set to 400 mL/min.

During the nucleation step and the particle growth step, a sodium hydroxide aqueous solution and ammonia water were supplied into the agitation tank in addition to the raw material liquid so as to maintain the pH value of the reaction aqueous solution and the ammonia concentration of the reaction aqueous solution.

The volume fraction of the highly supersaturated region in the reaction aqueous solution, calculated by simulation, was 0.025%. Note that the analysis conditions were set up to be the same as the above-described analysis conditions.

Figure 7:
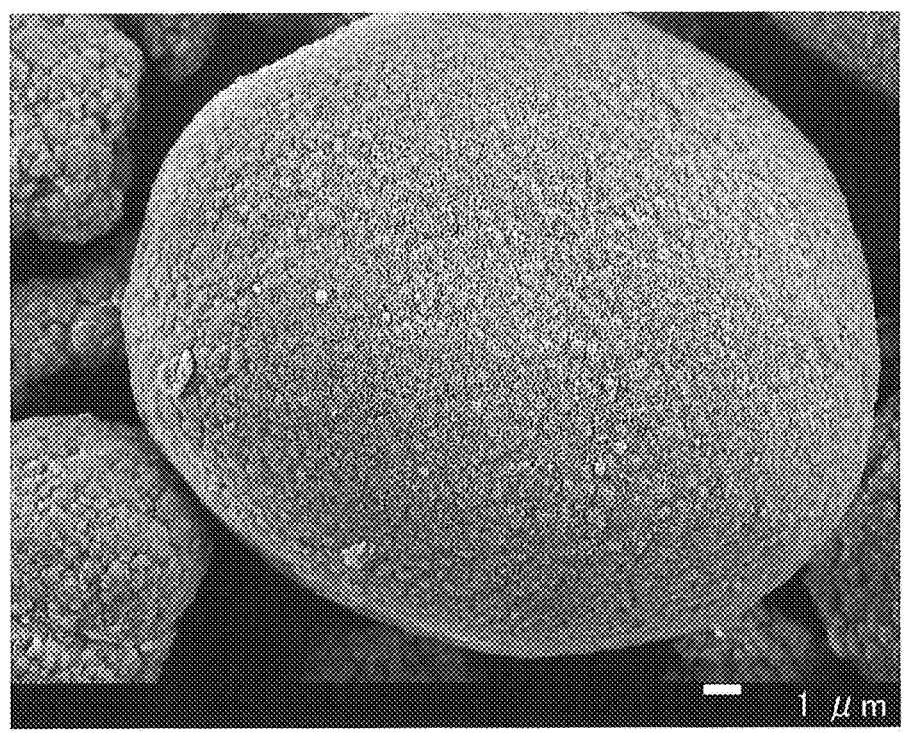
FIG. 7 is an SEM image of nickel composite hydroxide particles obtained in Example 1.

FIG. 7 shows an SEM image of nickel composite hydroxide particles obtained in Example 1. In FIG. 7, the outer surfaces of particles obtained at the completion of neutralization crystallization were smooth and hardly any roughness was observed.

Example 2

In Example 2, nickel composite hydroxide particles were produced in the same manner as in Example 1 except that the rotation speed of the impeller used in Example 1 was set to 150 rpm.

The volume fraction of the highly supersaturated region in the reaction aqueous solution, calculated by simulation in the same manner as in Example 1, was 0.090%. Note that the analysis conditions were set up to be the same as the above-described analysis conditions.

The nickel composite hydroxide particles obtained in Example 2 were similar to the nickel composite hydroxide particles obtained in Example 1 as shown in FIG. 7; the outer surfaces of the particles obtained at the completion of neutralization crystallization were smooth and hardly any roughness was observed.

Example 3

In Example 3, nickel composite hydroxide particles were produced in the same manner as in Example 1 except that the raw material liquid was prepared so that a nickel composite hydroxide with the formula $Ni_{0.88}Co_{0.09}Al_{0.03}(OH)_2$ could be obtained.

The volume fraction of the highly supersaturated region in the reaction aqueous solution, calculated by simulation in the same manner as in Example 1, was 0.025%. Note that the analysis conditions were set up to be the same as the above-described analysis conditions.

The nickel composite hydroxide particles obtained in Example 3 were also similar to the nickel composite hydroxide particles obtained in Example 1 as shown in FIG. 7; the outer surfaces of the particles obtained at the completion of neutralization crystallization were smooth and hardly any roughness was observed.

Example 4

In Example 4, the volume of the agitation tank was 60 L, a disk-blade turbine impeller was used, the impeller had six blades, the diameter of the impeller was 168 mm, the vertical distance between the impeller and the inner bottom surface of the agitation tank was 100 mm, and the rotation speed of the impeller was set to 425 rpm. The agitation tank was filled with 60 L of the reaction aqueous solution. The raw material liquid was prepared so that a nickel composite hydroxide with the formula $Ni_{0.82}Co_{0.15}Al_{0.03}(OH)_2$ could be obtained. One raw material liquid supply pipe was provided, and the feed rate of the raw material liquid supplied from one raw material liquid supply pipe was set to 120 mL/min. Aside from the above-noted conditions, nickel composite hydroxide particles were produced in the same manner as in Example 1.

The volume fraction of the highly supersaturated region in the reaction aqueous solution, calculated by simulation in the same manner as in Example 1, was 0.015%. Note that the analysis conditions were set up to be the same as the above-described analysis conditions.

The nickel composite hydroxide particles obtained in Example 4 were also similar to the nickel composite hydroxide particles obtained in Example 1 as shown in FIG. 7; the outer surfaces of the particles obtained at the completion of neutralization crystallization were smooth and hardly any roughness was observed.

Example 5

In Example 5, the volume of the agitation tank was 60 L, a 45° pitched paddle blade impeller was used, the impeller had four blades, the diameter of the impeller was 168 mm, the vertical distance between the impeller and the inner bottom surface of the agitation tank was 100 mm, and the rotation speed of the impeller was set to 500 rpm. The agitation tank was filled with 60 L of the reaction aqueous solution. The raw material liquid was prepared so that a nickel composite hydroxide with the formula $Ni_{0.82}Co_{0.15}Al_{0.03}(OH)_2$ could be obtained. One raw material liquid supply pipe was provided, and the feed rate of the raw material liquid supplied from one raw material liquid supply pipe was set to 120 mL/min. Aside from the above-noted conditions, nickel composite hydroxide particles were produced in the same manner as in Example 1.

The volume fraction of the highly supersaturated region in the reaction aqueous solution, calculated by simulation in the same manner as in Example 1, was 0.027%. Note that the analysis conditions were set up to be the same as the above-described analysis conditions.

The nickel composite hydroxide particles obtained in Example 5 were also similar to the nickel composite hydroxide particles obtained in Example 1 as shown in FIG. 7; the outer surfaces of the particles obtained at the completion of neutralization crystallization were smooth and hardly any roughness was observed.

Example 6

In Example 6, nickel composite hydroxide particles were produced in the same manner as in Example 1 except that the raw material liquid was prepared so that a nickel composite hydroxide with the formula $Ni_{0.34}Co_{0.33}Al_{0.33}(OH)_2$ could be obtained.

The volume fraction of the highly supersaturated region in the reaction aqueous solution, calculated by simulation in the same manner as in Example 1, was 0.025%. Note that the analysis conditions were set up to be the same as the above-described analysis conditions.

The nickel composite hydroxide particles obtained in Example 6 were also similar to the nickel composite hydroxide particles obtained in Example 1 as shown in FIG. 7; the outer surfaces of the particles obtained at the completion of neutralization crystallization were smooth and hardly any roughness was observed.

Example 7

In Example 7, nickel composite hydroxide particles were produced in the same manner as in Example 1 except that the raw material liquid was prepared so that a nickel composite hydroxide with the formula $Ni_{0.60}Co_{0.20}Al_{0.20}(OH)_2$ could be obtained.

The volume fraction of the highly supersaturated region in the reaction aqueous solution, calculated by simulation in the same manner as in Example 1, was 0.025%. Note that the analysis conditions were set up to be the same as the above-described analysis conditions.

The nickel composite hydroxide particles obtained in Example 7 were also similar to the nickel composite hydroxide particles obtained in Example 1 as shown in FIG. 7; the outer surfaces of the particles obtained at the completion of neutralization crystallization were smooth and hardly any roughness was observed.

Example 8

In Example 8, the volume of the agitation tank was 60 L, a disk-blade turbine impeller was used, the impeller had six blades, the diameter of the impeller was 168 mm, the vertical distance between the impeller and the inner bottom surface of the agitation tank was 100 mm, and the rotation speed of the impeller was set to 425 rpm. The agitation tank was filled with 60 L of the reaction aqueous solution. The raw material liquid was prepared so that a nickel composite hydroxide with the formula $Ni_{0.34}Co_{0.33}Al_{0.33}(OH)_2$ could be obtained. One raw material liquid supply pipe was provided, and the feed rate of the raw material liquid supplied from one raw material liquid supply pipe was set to 120 mL/min. Aside from the above-noted conditions, nickel composite hydroxide particles were produced in the same manner as in Example 1.

The volume fraction of the highly supersaturated region in the reaction aqueous solution, calculated by simulation in the same manner as in Example 1, was 0.015%. Note that the analysis conditions were set up to be the same as the above-described analysis conditions.

The nickel composite hydroxide particles obtained in Example 8 were also similar to the nickel composite hydroxide particles obtained in Example 1 as shown in FIG. 7; the outer surfaces of the particles obtained at the completion of neutralization crystallization were smooth and hardly any roughness was observed.

Example 9

In Example 9, the volume of the agitation tank was 60 L, a 45° pitched paddle blade impeller was used, the impeller had four blades, the diameter of the impeller was 168 mm, the vertical distance between the impeller and the inner bottom surface of the agitation tank was 100 mm, and the rotation speed of the impeller was set to 500 rpm. The agitation tank was filled with 60 L of the reaction aqueous solution. The raw material liquid was prepared so that a nickel composite hydroxide with the formula $Ni_{0.34}Co_{0.33}Al_{0.33}(OH)_2$ could be obtained. One raw material liquid supply pipe was provided, and the feed rate of the raw material liquid supplied from one raw material liquid supply pipe was set to 120 mL/min. Aside from the above-noted conditions, nickel composite hydroxide particles were produced in the same manner as in Example 1.

The volume fraction of the highly supersaturated region in the reaction aqueous solution, calculated by simulation in the same manner as in Example 1, was 0.027%. Note that the analysis conditions were set up to be the same as the above-described analysis conditions.

The nickel composite hydroxide particles obtained in Example 9 were also similar to the nickel composite hydroxide particles obtained in Example 1 as shown in FIG. 7; the outer surfaces of the particles obtained at the completion of neutralization crystallization were smooth and hardly any roughness was observed.

Comparative Example 1

In Comparative Example 1, nickel composite hydroxide particles were produced in the same manner as in Example 1 except that the feed rate of the raw material liquid from one raw material liquid supply pipe was set to 800 mL/min.

The volume fraction of the highly supersaturated region in the reaction aqueous solution, calculated by simulation in the same manner as in Example 1, was 0.100%.

Figure 8:
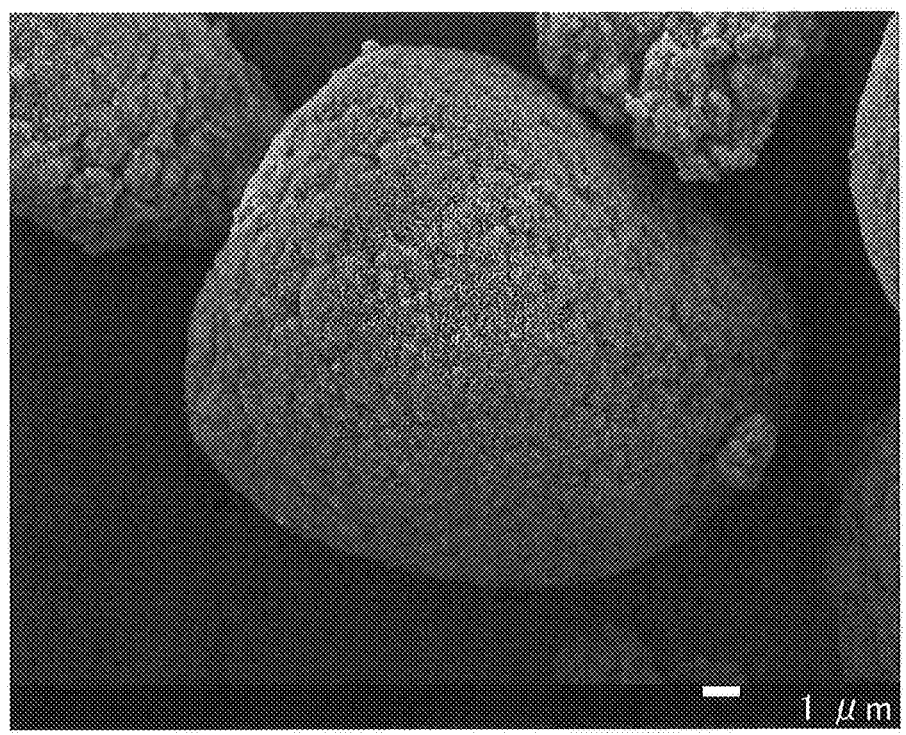
FIG. 8 is an SEM image of nickel composite hydroxide particles obtained in Comparative Example 1.

FIG. 8 shows an SEM image of the nickel composite hydroxide particles obtained in Comparative Example 1. As can be appreciated from FIG. 8, roughness could be observed clearly at the outer surfaces of the particles obtained at the completion of neutralization crystallization.

Comparative Example 2

In Comparative Example 2, nickel composite hydroxide particles were produced in the same manner as in Example 1 except that the raw material liquid was prepared so that a nickel composite hydroxide with the formula $Ni_{0.34}Co_{0.33}Mn_{0.33}(OH)_2$ could be obtained, and the feed rate of the raw material liquid from one raw material liquid supply pipe was set to 800 mL/min.

The volume fraction of the highly supersaturated region in the reaction aqueous solution, calculated by simulation in the same manner as in Example 1, was 0.100%.

The nickel composite hydroxide particles obtained in Comparative Example 2 was substantially similar to the particles obtained in Comparative Example 1 as shown in FIG. 8, and roughness could be observed clearly at the outer surfaces of the particles obtained at the completion of neutralization crystallization.

SUMMARY

As can be appreciated from Examples 1 to 9 and Comparative Examples 1 and 2, as long as the volume fraction of the highly supersaturated region in the reaction aqueous solution is less than 0.100%, the roughness of the outer surfaces of particles can be reduced even if the type of impeller, the diameter of the impeller, and the volume of the agitation tank are changed.

Although the method for producing a nickel-containing hydroxide according to the present invention have been described above with respect to illustrative embodiments, the present invention is not limited to the above-described embodiments and various modifications and improvements may be made within the scope of the present invention.

The present application claims priority to Japanese Patent Application No. 2016-118376 filed on Jun. 14, 2016, the entire contents of which are herein incorporated by reference.

DESCRIPTION OF THE REFERENCE NUMERALS 2 seed crystal particle
4 aggregate
6 outer shell
10 chemical reaction apparatus
12 highly supersaturated region
20 agitation tank
30 impeller
40 shaft
50 baffle
60 raw material liquid supply pipe
62 alkaline aqueous solution supply pipe
64 ammonia water supply pipe

The invention claimed is:

1. A method for producing a nickel-containing hydroxide, the method comprising:
   a nucleation step of generating nuclei of nickel-containing hydroxide particles by neutralization crystallization in an aqueous solution accommodated in an agitation tank;
   wherein in the nucleation step, a volume fraction of a highly supersaturated region in the aqueous solution where a molar concentration of the nickel-containing hydroxide dissolved in the aqueous solution is greater than or equal to 5.0 mol/m$^3$ is less than 0.100% of the aqueous solution.

2. The method for producing a nickel-containing hydroxide according to claim 1, wherein
   the nickel-containing hydroxide is produced so as to contain Ni, Co, and Al at an amount ratio of Ni:Co:Al=(1−x−y):x:y (where 0≤x≤0.3, 0.005≤y≤0.15).

3. The method for producing a nickel-containing hydroxide according to claim 1, wherein
   the nickel-containing hydroxide is produced so as to contain Ni, Co, Mn, and M (where M denotes at least one additional element selected from a group consisting of Ti, V, Cr, Zr, Nb, Mo, Hf, Ta, and W) at an amount ratio of Ni:Co:Mn:M=x:y:z:t (where x+y+z+t=1, 0.1≤x≤0.7, 0.1≤y≤0.5, 0.1≤z≤0.8, 0≤t≤0.02).

* * * * *